(12) United States Patent
Ryu et al.

(10) Patent No.: US 11,223,002 B2
(45) Date of Patent: Jan. 11, 2022

(54) SUPERLATTICE THERMOELECTRIC MATERIAL AND THERMOELECTRIC DEVICE USING SAME

(71) Applicants: LG ELECTRONICS INC., Seoul (KR); UNIVERSITY-INDUSTRY COOPERATION GROUP OF KYUNG HEE UNIVERSITY, Yongin-si (KR)

(72) Inventors: Byunggil Ryu, Seoul (KR); Jongsoo Rhyee, Hwaseong-si (KR)

(73) Assignees: LG ELECTRONICS INC., Seoul (KR); UNIVERSITY-INDUSTRY COOPERATION GROUP OF KYUNG HEE UNIVERSITY, Yongin-si (KR)

( * ) Notice: Subject to any disclaimer, the term of this patent is extended or adjusted under 35 U.S.C. 154(b) by 134 days.

(21) Appl. No.: 16/327,757

(22) PCT Filed: Aug. 21, 2017

(86) PCT No.: PCT/KR2017/009073
§ 371 (c)(1),
(2) Date: Feb. 22, 2019

(87) PCT Pub. No.: WO2018/038477
PCT Pub. Date: Mar. 1, 2018

(65) Prior Publication Data
US 2019/0237646 A1    Aug. 1, 2019

(30) Foreign Application Priority Data
Aug. 22, 2016  (KR) .................. 10-2016-0106189

(51) Int. Cl.
*H01L 35/02*  (2006.01)
*H01L 35/16*  (2006.01)
(Continued)

(52) U.S. Cl.
CPC .............. *H01L 35/02* (2013.01); *H01L 35/14* (2013.01); *H01L 35/16* (2013.01); *H01L 35/18* (2013.01); *H01L 35/32* (2013.01)

(58) Field of Classification Search
CPC ......... H01L 35/14; H01L 35/16; H01L 35/26; H01L 35/28; H01L 35/02; H01L 35/32
(Continued)

(56) References Cited

U.S. PATENT DOCUMENTS

2006/0249704 A1* 11/2006 Ren .................... H01L 35/26
                                                     252/62.3 T
2007/0240750 A1* 10/2007 Snyder ................ H01L 35/26
                                                     136/201
(Continued)

FOREIGN PATENT DOCUMENTS

JP         5001396          8/2012
KR      1020050034582       4/2005
(Continued)

OTHER PUBLICATIONS

Wang et al, Anatomically Smooth Ultrathin Films of Topological Insulator Sb2Te3, 2010, Nano Res. 3(12) 874-880. (Year: 2010).*
(Continued)

*Primary Examiner* — Andrew J Golden
(74) *Attorney, Agent, or Firm* — Lee, Hong, Degerman, Kang & Waimey PC

(57) ABSTRACT

The present disclosure relates to a thermoelectric material, and more specifically to a superlattice thermoelectric material and a thermoelectric device using the same. The superlattice thermoelectric material has a composition of a following Chemical Formula 1:

$(AX)_n(D_2X'_3)_m$  ,<Chemical Formula 1> wherein, in the Chemical Formula 1, A is at least one of Ge, Sn, and Pb, X is a chalcogen element, and at least
(Continued)

one of S, Se, and Te, D is at least one of Bi and Sb, each of n and m is an integer between 1 and 100, and A or X is at least partially substituted with a dopant.

18 Claims, 4 Drawing Sheets

(51) Int. Cl.
  *H01L 35/18* (2006.01)
  *H01L 35/32* (2006.01)
  *H01L 35/14* (2006.01)
(58) Field of Classification Search
  USPC .................................................. 136/200–242
  See application file for complete search history.

(56) References Cited

U.S. PATENT DOCUMENTS

| | | | | |
|---|---|---|---|---|
| 2008/0087314 | A1* | 4/2008 | Xiao | H01L 35/34 |
| | | | | 136/201 |
| 2008/0289677 | A1* | 11/2008 | Bell | H01L 35/26 |
| | | | | 136/236.1 |
| 2010/0233454 | A1 | 9/2010 | Johnson et al. | |
| 2014/0027681 | A1* | 1/2014 | Snyder | H01L 35/34 |
| | | | | 252/519.14 |
| 2015/0107640 | A1* | 4/2015 | Caylor | H01L 35/34 |
| | | | | 136/238 |
| 2015/0155464 | A1* | 6/2015 | Xu | H01L 35/32 |
| | | | | 136/200 |
| 2016/0111643 | A1* | 4/2016 | Yeom | B82Y 10/00 |
| | | | | 257/29 |
| 2016/0300992 | A1* | 10/2016 | Rhyee | H01L 35/18 |

FOREIGN PATENT DOCUMENTS

| | | | | |
|---|---|---|---|---|
| KR | 1020110071291 | | 6/2011 | |
| KR | 1020120050905 | | 5/2012 | |
| KR | 1020140116668 | | 10/2014 | |
| WO | WO-2015108380 | A1 * | 7/2015 | ............. H01L 35/18 |

OTHER PUBLICATIONS

PCT International Application No. PCT/KR2017/009073, Written Opinion of the International Searching Authority dated Nov. 15, 2017, 11 pages.

Korean Intellectual Property Office Application No. 10-2016-0106189, Notice of Allowance dated Dec. 13, 2017, 6 pages.

Avilov, E. S. et al., "Thermoelectric Figure of Merit and Magnetic Field Production Abilities of 'Natural' PbBi2(Te1-xSex)4 + δ and PbBi4(Te1-xSex)7 + δ Nanostructures," Inorganic Materials: Applied Research, 2016, vol. 7, No. 2, pp. 177-186, 10pages.

* cited by examiner

SUPERLATTICE THERMOELECTRIC MATERIAL AND THERMOELECTRIC DEVICE USING SAME

CROSS-REFERENCE TO RELATED APPLICATIONS

This application is the National Stage filing under 35 U.S.C. 371 of International Application No. PCT/KR2017/009073, filed on Aug. 21, 2017, which claims the benefit of earlier filing date and right of priority to Korean Application No. 10-2016-0106189, filed on Aug. 22, 2016, the contents of which are all hereby incorporated by reference herein in their entirety.

TECHNICAL FIELD

The present disclosure relates to a thermoelectric material, and more specifically to a superlattice thermoelectric material and a thermoelectric device using the same.

BACKGROUND

A thermoelectric effect refers to a reversible and direct energy conversion between a heat and an electricity. The thermoelectric effect results from movements, within a material, of a charge carrier, that is, an electrode and a hole.

In general, a thermoelectric material may be applied to an active cooling, a cogeneration, and the like using a Peltier effect and a Seebeck effect.

The Peltier effect is a phenomenon in which a hole in a p-type material and an electron in a n-type material move when a direct current (DC) voltage is applied from outside, resulting in exothermic and endothermic phenomena across the material. The Seebeck effect is a phenomenon in which an electron and a hole move when a heat is supplied from an external heat source, thereby generating a flow of a current to generate a power.

The active cooling using this thermoelectric material may improve a thermal stability of a device, generate no vibration and noise, and may not use a separate condenser and a refrigerant. Thus, the active cooling has been recognized as a compact and environment-friendly method.

The active cooling using this thermoelectric material may also be used for a refrigerant-free refrigerator, an air conditioner, various micro cooling systems, and the like. In particular, when a thermoelectric device is attached to various memory devices respectively, the device may be maintained at a uniform and stable temperature while reducing a volume compared to conventional cooling schemes. Thus, a performance of the device may be improved.

In one example, when the thermoelectric material is used for the thermoelectric power generation using the Seebeck effect, a waste heat may be used as an energy source. Therefore, the thermoelectric material may be applied to various fields such as an engine and an exhaust device of an automobile, an incineration plant, a steel mill waste heat, and the like to improve an energy efficiency and collect the waste heat. For example, a human body heat may be used as a power source for a medical device in a human body.

Not only a thermal conductivity should be reduced, but also a power factor defined as $S^2\sigma$ should be high to improve the performance of this thermoelectric material. However, a research on increasing the power factor actually has not been done much.

DISCLOSURE

Technical Purpose

A technical purpose of the present disclosure is to provide a thermoelectric material having a high efficiency thermoelectric performance Further, a technical purpose of the present disclosure is to provide a high efficiency thermoelectric device using this thermoelectric material.

The technical purposes to be achieved in the present disclosure are not limited to the technical purposes as mentioned above. Other technical purposes not mentioned may be clearly understood, from following descriptions, to those skilled in the art to which the present disclosure belongs.

Technical Solution

In a first aspect of the present disclosure, there is provided a superlattice thermoelectric material having $(AX)_n(D_2X'_3)_m$ 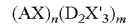 ,<Chemical Formula 1> wherein, in the Chemical Formula 1,

A is at least one of Ge, Sn, and Pb, X is a chalcogen element, and at least one of S, Se, and Te, D is at least one of Bi and Sb, each of n and m is an integer between 1 and 100, and A or X is at least partially substituted with a dopant.

In this connection, in Chemical Formula 1, the A may be the Sn.

In this connection, in Chemical Formula 1, a weight percentage of the Sn may be in a range of from 3 inclusive to 5% inclusive based on a weight of the substance D.

In this connection, the dopant may include a p-type dopant to be substituted into A or an n-type dopant to be substituted into X.

In this connection, the p-type dopant may include at least one of Ga, In, Zn, Cu, Ag, and Sn.

Further, the n-type dopant may include at least one of Cl, Br, and I.

In this connection, at least one of the p-type dopant and the n-type dopant may be contained such that a metallic interface may exist between the AX substance and the $D_2X'_3$ substance.

In this connection, the AX substance may be an insulator, or a substance with a topologically protected surface having a property of a metal only at the surface.

In this connection, the $D_2X'_3$ may be a substance with a topologically protected surface having a property of a metal only at the surface.

In this connection, a metallic interface may exist between the AX substance and the D2X'3 substance.

In this connection, the AX may be at least one of GeTe, SnTe, GeSe, and SnSe.

In this connection, the $D_2X'_3$ may be $Bi_2Te_3$ or $Sb_2Te_3$.

In this connection, a sum of the n and the m may have a constant value.

In a second aspect of the present disclosure, there is provided a thermoelectric device including a superlattice thermoelectric material, the device comprising: first thermoelectric elements made of a superlattice thermoelectric material, second thermoelectric elements made of a superlattice thermoelectric material, and a plurality of electrodes electrically connected to each other in series via the first thermoelectric and second thermoelectric elements, wherein the superlattice thermoelectric material is represented by a following Chemical Formula 1:

$(AX)_n(D_2X'_3)_m$ 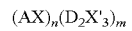 ,<Chemical Formula 1>

In the Chemical Formula 1, A is at least one of Ge, Sn, and Pb, X is a chalcogen element, and at least one of S, Se, and Te, D is at least one of Bi and Sb, each of n and m is an integer between 1 and 100, and A or X is at least partially substituted with a dopant.

In this connection, the first thermoelectric element has a property of an n-type semiconductor, and the second thermoelectric element has a property of a p-type semiconductor.

In this connection, a dopant for the property of the p-type semiconductor may include at least one of Ga, In, Zn, Cu, Ag, and Sn.

In this connection, a dopant for the property of the n-type semiconductor may include at least one of Cl, Br, and I.

In this connection, at least one of the p-type dopant and the n-type dopant may be contained such that a metallic interface exists between the AX substance and the $D_2X'_3$ substance.

In this connection, the A may be the Sn.

In this connection, a weight percentage of the Sn may be in a range of from 3 inclusive to 5% inclusive based on a weight of the substance D.

Technical Effect

The present disclosure has non-limiting following effects.

First, the superlattice structure-based thermoelectric material may realize a low thermal conductivity at a bulk state. Generation of a charge density wave causes further thermal conductivity reduction. Providing a high charge mobility via presence of the topologically protected surface may realize a thermoelectric material with a high electrical conductivity.

Further, since the thermoelectric material according to the present disclosure has a high performance in a room temperature or a middle temperature range, such a thermoelectric material may be widely used for non-refrigerant solid cooling, general refrigerating in an air conditioner/refrigerator, waste heat power generation, military/aerospace thermoelectric nuclear power generation, fuel cell combined power generation, etc.

Effects that may be obtained from the present disclosure are not limited to the effects mentioned above. Other effects as not mentioned may be clearly understood to those skilled in the art to which the present disclosure belongs from the following descriptions.

DETAILED DESCRIPTIONS

Hereinafter, embodiments of the present disclosure will be described in detail with reference to the accompanying drawings.

The present disclosure may include various modifications and variations. Specific embodiments of the present disclosure are illustrated by way of the drawings, and will be described in detail below. However, it will be understood that the description herein is not intended to limit the claims to the specific embodiments described. To the contrary, the present disclosure is intended to cover alternatives, modifications, and equivalents as may be included within the spirit and scope of the present disclosure as defined by the appended claims.

It will be understood that when a first element such as a layer, region, or substrate is referred to as being "on" a second element, the first element may be "directly on" the second element or an intervening element may also be present therebetween.

It will be understood that, although terms first, second, etc. may be used herein to describe various elements, components, areas, layers, and/or regions, these elements, components, areas, layers and/or regions should not be limited by these terms.

A performance of a thermoelectric material may also be represented by a FIG. of merit (ZT) value, which is defined as Equation 1, and collectively referred to as a dimensionless FIG. of merit.

$$ZT = \frac{S^2 \sigma T}{k} \qquad \text{[Equation 1]}$$

In Equation 1, S refers to a Seebeck coefficient (a thermoelectric power generated due to a temperature difference per 1° C.), σ refers to an electrical conductivity, T refers to an absolute temperature, and κ refers to a thermal conductivity. $S^2\sigma$ refers to a power factor.

As shown in Equation 1 above, the Seebeck coefficient S and the electrical conductivity σ, that is, the power factor $S^2\sigma$ should increase, and the thermal conductivity κ should decrease in order to increase the FIG. of merit (ZT) of the thermoelectric material.

However, the Seebeck coefficient and the electrical conductivity are in a trade-off relationship. Therefore, when one value increases, the other value decreases based on a change in a concentration of an electron or a hole as a carrier.

For example, a Seebeck coefficient of a metal having a high electrical conductivity is low, and a Seebeck coefficient of an insulating material having a low electrical conductivity is high. Such a trade-off relationship between the Seebeck coefficient and the electrical conductivity is a major limitation in increasing the power factor.

Therefore, an independent control of a property of matter is required to achieve a high ZT value.

Figure 1:
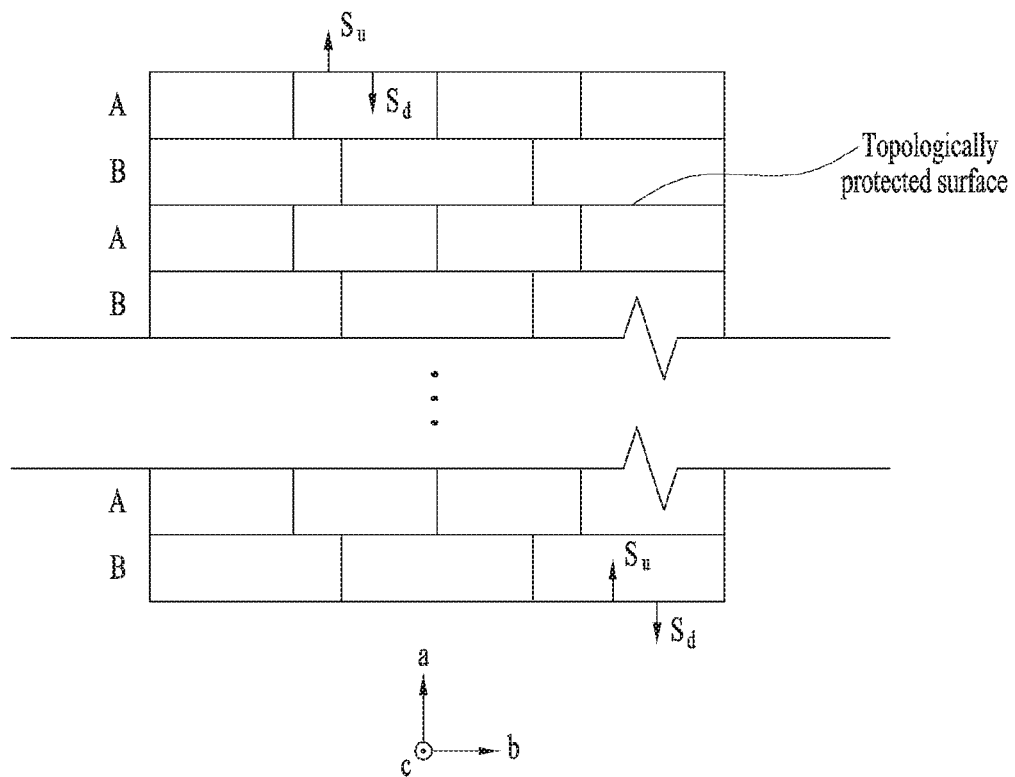
FIG. 1 is a schematic view illustrating a superlattice thermoelectric material according to an embodiment of the present disclosure.

FIG. 1 is a schematic view illustrating a superlattice thermoelectric material according to an embodiment of the present disclosure.

As shown in FIG. 1, in the present disclosure, a natural superlattice is made of two substances A and B, at least one of which causes a Pierls distortion. In this connection, the present disclosure is to provide the natural superlattice that may greatly increase the Seebeck coefficient by allowing a topologically protected surface between the two substances A and B.

In this connection, in the substance A, an up-spin current $S_u$ is directed outward, and a down-spin current $S_d$ is directed inward. Further, in the substance B, the up-spin current $S_u$ is directed inward, and the down-spin current $S_d$ is directed outward. Thus, the spin currents may not be counteracted.

The thermoelectric material may be represented by Chemical Formula 1.

$(AX)_n(D_2X'_3)_m$ [Chemical Formula 1]

In this Chemical Formula 1, A may be any of Ge, Sn, and Pb as a p-type metalloid.

AX refers to chalcogen compound, and X may be at least one of S, Se, and Te.

D may be at least one of Bi and Sb, or may be a mixture of the Bi and the Sb.

In this connection, n and m are integers between 1 and 100. For example, a sum of the n and the m may be 100. For example, when the n is 5, the m may be 95.

In this connection, A or X may be at least partially substituted with a dopant.

In this connection, in Chemical Formula 1, the A may be the Sn.

In this connection, in Chemical Formula 1, a weight percentage of the Sn is in a range of from 3% inclusive to 5% inclusive based on a weight of the substance D.

In this connection, the dopant may include a p-type dopant to be substituted into the A or an n-type dopant to be substituted into the X.

In this connection, the p-type dopant may include at least one of Ga, In, Zn, Cu, Ag, and Sn.

Further, the n-type dopant may include at least one of Cl, Br, and I.

In this connection, in Chemical Formula 1, the AX substance may be a nonconductor, or an insulator with a topologically protected surface.

In this connection, in Chemical Formula 1, the $D_2X'_3$ may be a substance with a topologically protected surface.

In this connection, in Chemical Formula 1, a metallic interface may exist between the AX substance and the $D_2X'_3$ substance.

In this connection, in Chemical Formula 1, the AX may be at least one of GeTe, SnTe, GeSe, and SnSe.

In this connection, in Chemical Formula 1, $D_2X'_3$ is $Bi_2Te_3$ or $Sb_2Te_3$.

A detailed description of this superlattice thermoelectric material is as follows.

<Pierls distortion>

When a carrier density increases in a metal lattice, and, thus, an electron-phonon interaction between an electron and a phonon becomes stronger, the electron-phonon interaction may eventually be interpreted using a one-dimensional electron model.

When a charge in the metal lattice is reduced, and a dimension is reduced, a Coulomb interaction between an ion and the electron becomes stronger, which becomes more stronger in a small space.

In this case, an energy in the lattice may become unstable. In addition, the electron may behave like a heavy phonon to reduce an energy of an entire system. As a result, two electrons may be considered as one ion.

This is because a lattice vibration is greatly reduced by the Coulomb interaction. Consequently, in one-dimension, a metal has a property of a semiconductor or a nonconductor, which is called Pierls distortion.

As a result, an energy bandgap of the substance is controlled by the electron-phonon interaction, and features thereof are summarized as follows.

(1) Lattice distortion-in a spring model that connects atoms, a spring may be broken, or may be arbitrarily connected.

(2) Phonon softening—it means that the spring in the above model is weak. The lattice vibration may not be transmitted well.

The phonon transfers a heat in the substance, which causes the thermal conductivity to drop.

(3) Seebeck coefficient increase

As described above, the Pierls distortion eventually lowers the thermal conductivity. Therefore, the Seebeck coefficient increases based on Equation 1. Further, in Equation 1, the electrical conductivity may be adjusted by adjusting the current density, thus further controlling the Seebeck coefficient.

In general, the Seebeck coefficient is proportional to a slope of a density of state. Further, the Seebeck coefficient is proportional to a second change rate in momentum with respect to the energy.

The density of state in two-dimension increases, based on the energy, in a stepped shape. On the other hand, the density of state in one-dimension has the same shape as a delta function. This may be realized by the quantum confinement effect, and may also be realized by a structure such as a nanowire.

Like this, the current density may be adjusted by doping an appropriate transition metal element in the X or X' position of Chemical Formula 1, resulting in a charge density wave. The charge density wave refers to a substance in the superlattice shape in which the lattice distortion has occurred due to the strong electron-phonon interaction. In the charge density wave, an electron density and a periodicity of the lattice distortion coincide with each other.

When the charge density wave occurs, the strong electron-phonon interaction cause a phonon energy to sharply decrease, resulting in the lattice distortion, thereby further lowering the thermal conductivity.

<Natural Superlattice>

In the early 1990s, research on a manufacture of a superlattice using the thermoelectric material was conducted. As an example, two substances of the thermoelectric material may be stacked alternately in one direction (for example, on an atomic layer basis). The electron may move in a stacked direction. That is, a conductivity may be maintained, but a scattering occurs when the phonon moves in the stacked direction. That is, the thermal conductivity is lowered. Therefore, the dimensionless FIG. of merit ZT value may be improved.

However, such superlattice (hereinafter referred to as an artificial superlattice) may not be manufactured in a bulk, and thus is difficult to use in the thermoelectric material In contrast, the natural superlattice is a substance that exists in nature, and may be manufactured into the bulk.

With reference to FIG. 1, the natural superlattice is a substance in which two different substances A and B are alternately stacked.

This natural superlattice will be described using an example of a square lattice.

When a unit cell has lattice constants in directions a, b, and c, lattice constants of the two substances A and B in the direction a are equal to each other, but lattice constants of the two substances A and B in the direction b are different from each other. However, when several lattices are arranged in the direction b, a total width of entire lattices of the substance A and a total width of entire lattices of the substance B in the direction b may be equal to each other. Alternatively, a boundary of at least one of the lattices of the substance A and a boundary of at least one of the lattices of the substance B coincide with each other.

That is, with reference to FIG. 1, a total width of four cells of the substance A in the direction b and a total width of three cells of the substance B in the direction b are equal to each other.

A material having such a structure is called the natural superlattice, and may form a thermodynamically stable structure. Each of the substances A and B has a high thermal conductivity. However, when the substances A and B form such a natural superlattice structure, the thermal conductivity thereof is lowered.

Therefore, the use of this natural superlattice as a thermoelectric material may improve the FIG. of merit.

In conclusion, the FIG. of merit may be further improved when one or more of the two substances A and B that constitute the natural superlattice has the Pierls distortion.

<Topological Insulator>

A topological insulator is a nonconductor with a topologically protected surface. The topologically protected surface means a metallic interface with a mathematical topological order according to a special physical condition. A nonconductor with this characteristic is called a topological insulator.

The characteristics of the topological insulator are that at the bulk state thereof, the topological insulator has a nonconductor or semiconductor property, but the surface thereof has a stable metal surface having the spin current. That is, the inner portion of the topological insulator has the characteristics of the nonconductor or semiconductor, while the surface thereof has the characteristic of a metal.

Example of a material having such characteristics of the topological insulator may include mono-chalcogenide compounds including PbTe, PbSe, PbS, SnTe, and SnSe.

The conductivity $\sigma$ of this topological insulator may be divided into the conductivity $\sigma_s$ at the surface of the insulator and the conductivity $\sigma_b$ in the inner portion of the insulator, as shown in Equation 2 below:

$$\sigma = \sigma_s + \sigma_b \quad \text{[Equation 2]}$$

In this connection, the Seebeck coefficient S may be represented using Equation 3.

$$S = \frac{S_s \sigma_s + S_b \sigma_b}{\sigma_s + \sigma_b} \quad \text{[Equation 3]}$$

Thus, the power factor power factor $S^2 6$ may be represented using Equation 4.

$$S^2 \sigma = \frac{(S_s \sigma_s + S_b \sigma_b)^2}{\sigma} \geq S_b^2 \sigma_b \quad \text{[Equation 4]}$$

Thus, increasing $S_s \sigma_s$ may improve the power factor. Thus, increasing the number of grain boundaries via producing more metal chains in the bulk may allow the power factor to be improved.

As described above, the FIG. of merit may be further improved when one or more of the two substances A and B that constitute the natural superlattice has the Pierls distortion. Further, the FIG. of merit may be further improved when the surface between the two substances A and B defines a topologically protected surface.

However, when two substances, each having the topologically protected surface, meet each other to form the superlattice, the current may not appear at the interface therebetween. That is, the current may exist only at the outermost side. Therefore, it may be necessary to further adjust the topologically protected surface.

Thus, using the properties of the substance having a topologically protected surface, the topologically protected surface can be controlled such that each interface between the two substances to form the superlattice together is a topologically protected surface.

This control may refer to the term "spin momentum locking". This will be described in detail.

Figure 2:
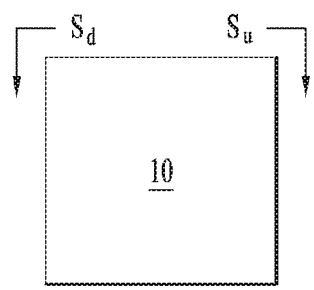
FIG. 2 is a schematic view illustrating a spin state of a substance with a topologically protected surface.
Figure 3:
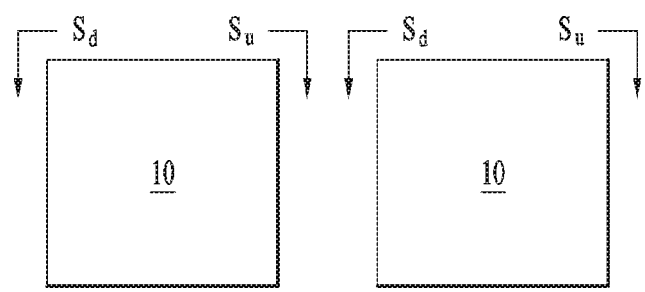
FIG. 3 is a schematic view illustrating an example of a state in which two substances respectively having topologically protected surfaces contact each other.

FIG. 2 is a schematic view illustrating a spin state of a substance with a topologically protected surface. FIG. 3 is a schematic view illustrating an example of a state in which two substances respectively having topologically protected surfaces contact each other.

As shown in FIG. 2, a substance 10 with a topologically protected surface may have a clockwise up-spin $S_u$ state and a counterclockwise down-spin $S_d$ state. In this connection, the directions are defined for a convenience. The directions may be opposite to each other.

In this connection, when the two substances 10 with topologically protected surfaces are in contact with each other, spin (spin current) exists on outer sides of respective substances 10, but two spins may be counteracted with each other on a face where the two substances 10 meet. Therefore, the current may not exist on the interface between the two substances 10, but may exist only at the outer faces of the two substances 10.

Figure 4:
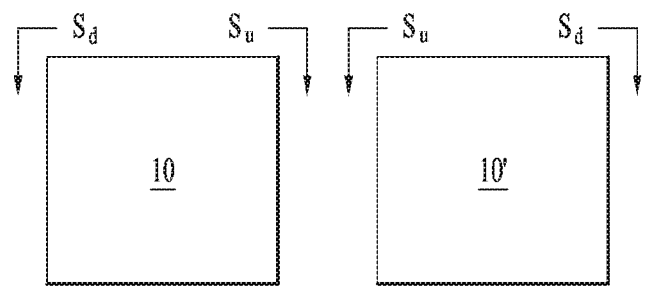
FIG. 4 is a schematic view illustrating another example of a state in which two substances respectively having topologically protected surfaces contact each other.

FIG. 4 is a schematic view illustrating another example of a state in which two substances respectively having topologically protected surfaces contact each other.

With reference to FIG. 4, when a substance 10 having a topologically protected surface and two spin directions and a substance 10' having a topologically protected surface having switched two spin directions meet each other, the two spins may not be counteracted at the interface between the two substances 10 and 10'. That is, the inversion symmetry may be used to control the topologically protected surface at the interface between the two substances 10 and 10'.

Figure 5:
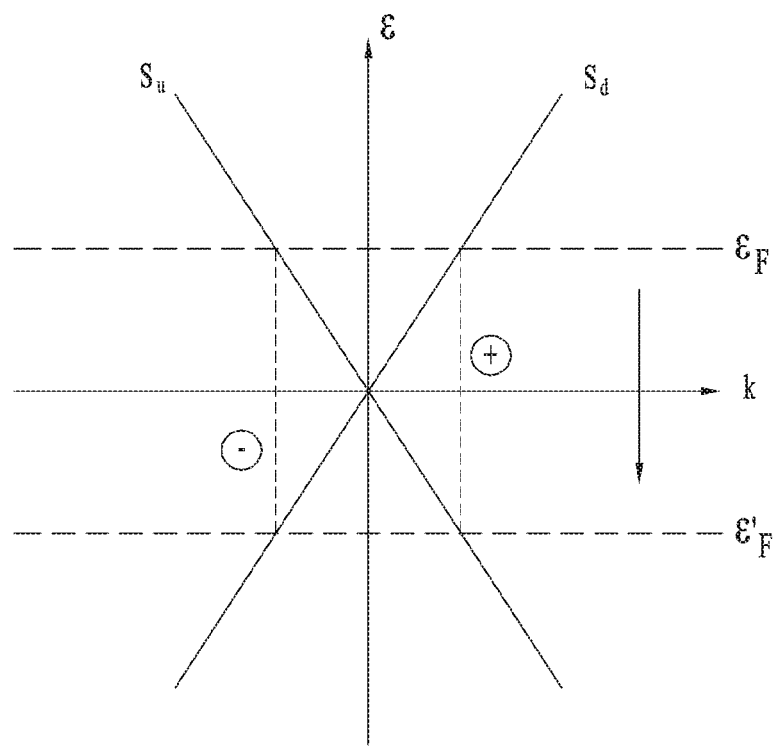
FIG. 5 is a graph illustrating a state in FIG. 4.

FIG. 5 is a graph illustrating a state in FIG. 4.

With reference to FIG. 5, the switched two spin directions of the substance 10' having a topologically protected surface may be accomplished by physically shifting the Fermi level.

That is, for the positive Fermi level $\varepsilon_F$, the up-spin $S_u$ state has a negative value, and the down-spin $S_d$ state has a positive value, whereas, for the negative Fermi level $\varepsilon'_F$, the up-spin $S_u$ state has a positive value, and the down-spin $S_d$ state has a negative value.

Therefore, adjusting the Fermi level may control the topologically protected surface at the interface between the two substances 10 and 10' via using the inverse symmetry.

Such adjustment of the Fermi level may be controlled via doping.

In this connection, when the n-type doping and the p-type doping are mixed, the Seebeck coefficient compensation between the n-type and p-type may occur and thus the Seebeck coefficient may be lowered. Thus, to prevent this situation, each of the energy gaps of the substances should be large enough such that each substance is considered a dielectric.

An example of a base substance having such characteristics may include $(Bi,Sb_2)Te_3$. In this connection, the Fermi level may be adjusted by partially substituting Sb with Sn via doping.

In this connection, an effective Sn doping level may be in a range of about 3 to 5 wt % based on a weight of the Sb substance. That is, when Sb is 95 to 97% by weight, Sn may be contained in an amount of 3 to 5% by weight.

However, the doping may cause the Pierls distortion.

Thus, there is a topologically protected metallic interface between the AX substance and the $D_2X'_3$ substance. One form of the topologically protected metallic interface may exhibit a chiral anomaly phenomenon that a magnetoresistance becomes a negative value when a direction of the current and a direction of the magnetic field coincide with each other.

EXAMPLES

In a specific example of the present disclosure, GeTe, SnTe, GeSe, SnSe or the like may be used as the AX substance. Each of these substances may have a cubic or hexagonal structure. Each of these substances may have characteristics of TCI (topological crystalline insulator) due to a geometric symmetry.

Figure 6:
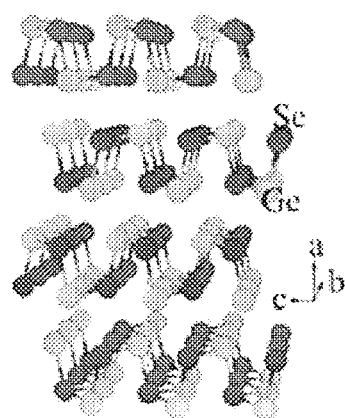
FIG. 6 illustrates a crystal structure of GeSe, which may be used in the present disclosure.

FIG. 6 shows a crystal structure of GeSe, which may be used in the present disclosure.

Further, each of the substances used as the above-mentioned AX may have a zig-zag quasi 1-D chain shape having a chair arm shape as shown in FIG. 6.

A Fermi surface of p-type doped GeSe as doped with holes is likely to have a two-dimensional Fermi surface depending on the crystal structure. Thus, when the p-type doping is performed into this substance and proper current density is maintained therein, a charge-density wave phase transition may be induced by strong charge-phonon interaction.

The $D_2X'_3$ in Chemical Formula 1 of the present disclosure may representatively include $Bi_2Te_3$ or $Sb_2Te_3$. $Bi_2Te_3$ or $Sb_2Te_3$ is a typical phase preservation-based substance. $Bi_2Te_3$ or $Sb_2Te_3$ has a hexagonal structure and, therefore, may form a coherent interface with AX substance and thus may form a natural superlattice structure between AX and $Bi_2Te_3$ or $Sb_2Te_3$.

For example, to produce $[GeTe]_n[Bi_2Te_3]_m$ material, each of Ge, Te, and Bi is weighed at a correct molar ratio and is put into a quartz tube. In turn, the tube is vacuum sealed. Then, the elements in the tube are melted at a temperature of 1100° C. or lower for 24 hours and is heat-treated for 24 hours or more at a temperature of 600 to 900° C.

In order to form a single crystal, each of Ge, Te, and Bi is weighed at a correct molar ratio and is put into a quartz tube. In turn, the tube is vacuum sealed. Then, the elements in the tube are melted at a temperature of 1100° C. Then, the melt slowly escapes from the heating zone heating zone at a rate of 1 to 10 mm/h. Then, when the melt reaches the cooling zone, a crystal is formed. Thus, the sample completely exits the heating zone, the crystal structure may be obtained. This process may be referred to as a Bridgman crystal growth method.

Figure 7:
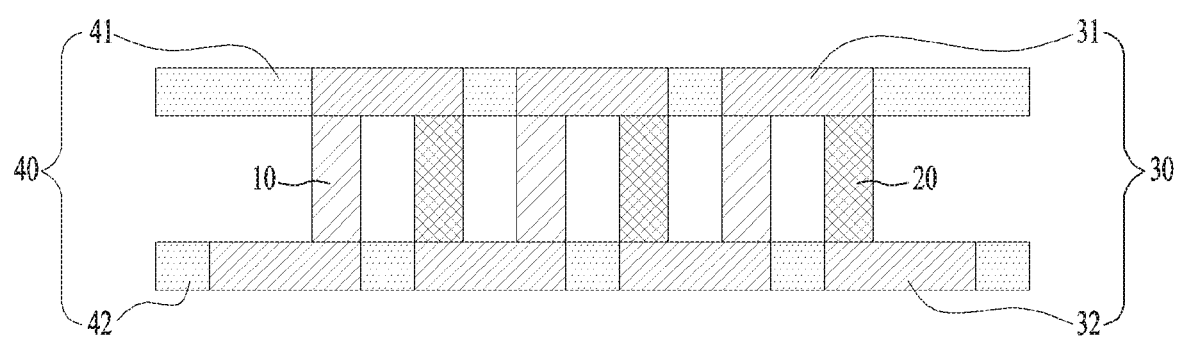
FIG. 7 is a cross-sectional view illustrating an example of a thermoelectric device that may be manufactured using a superlattice thermoelectric material of the present disclosure.

FIG. 7 is a cross-sectional view illustrating an example of a thermoelectric device that may be manufactured using a superlattice thermoelectric material in accordance with the present disclosure.

As shown in FIG. 7, the thermoelectric device may include thermoelectric elements 10 and 20, electrodes 30 electrically connecting these thermoelectric semiconductors 10 and 20, and substrates 40 for supporting the electrodes 30 respectively.

The thermoelectric elements 10 and 20 may include a first thermoelectric element 10 with a first conductivity and a second thermoelectric element 20 with a second conductivity.

Each of the thermoelectric elements 10 and 20 may be made of a substance which may be represented by the Chemical Formula 1 described above.

One first thermoelectric element 10 and one second thermoelectric element 20 form a pair. A plurality of pairs of the first thermoelectric element 10 and second thermoelectric element 20 may be arranged linearly. In this connection, orientations of the first thermoelectric element 10 and second thermoelectric element 20 may be parallel to each other.

The electrodes 30 includes a first electrode 31 electrically coupled to one end of the pair of the thermoelectric elements 10 and 20, and a second electrode 32 electrically coupled to the other end of the pair of the thermoelectric elements 10 and 20.

Each electrode 30 may include a metal material having a high electricity conductivity such as copper (Cu), aluminum (Al), or silver (Ag).

The first electrode 31 and the second electrode 32 may be arranged such that the first electrode 31 and the second electrode 32 are connected to each other in series via the pair of the thermoelectric elements 10 and 20 therebetween.

That is, as shown in FIG. 7, each of the first electrode 31 and the second electrode 32 is made of a metal piece. The first electrode 31 and the second electrode 32 are connected to each other in series via the pair of the thermoelectric elements 10 and 20 therebetween.

The substrates 40 may be located outside the first electrode 31 and second electrode 32. Each substrate 40 may be made of a material such as an aluminum oxide $Al_2O_3$.

In FIG. 7, a first substrate 41 is located to support the first electrode 31 laterally and a second substrate 42 is positioned to support the second electrode 32 laterally. The present disclosure is not limited thereto. The first substrate 41 is located to support the first electrode 31 vertically and the second substrate 42 is positioned to support the second electrode 32 vertically.

In accordance with the embodiments of the present disclosure, the superlattice structure-based thermoelectric material may realize a low thermal conductivity at a bulk state. Generation of a charge density wave causes further thermal conductivity reduction. Providing a high charge mobility via presence of the topologically protected surface may realize a thermoelectric material with a high electrical conductivity.

Further, since the thermoelectric material according to the present disclosure has a high performance in a room temperature or a middle temperature range, such a thermoelectric material may be widely used for non-refrigerant solid cooling, general refrigerating in an air conditioner/refrigerator, waste heat power generation, military/aerospace thermoelectric nuclear power generation, fuel cell combined power generation, etc.

The embodiments of the present disclosure as disclosed in this specification and drawings are merely illustrative of specific examples for purposes of understanding the present disclosure. The scope of the present disclosure is not intended to be limited thereto. It will be apparent to those skilled in the art that other variations other than the embodiments disclosed herein are feasible based on the technical idea of the present disclosure.

INDUSTRIAL APPLICABILITY

The present disclosure may improve the sensitivity and brightness. Further, the color rendering index can be improved to provide a high efficiency yellow light-emitting phosphor.

The invention claimed is:

1. A superlattice thermoelectric material having a composition of a following Chemical Formula 1:

<Chemical Formula 1>$(AX)_n(D_2X'_3)_m$, wherein, in the Chemical Formula 1,

A is at least one of Ge, Sn, or Pb, each of X and X' is a chalcogen element, and at least one of S, Se, or Te, D is at least one of Bi or Sb, each of n and m is an integer between 1 and 100, wherein a sum of n and m has a constant value, wherein n-layer of the AX substance and m-layer of the $D_2X'_3$ substance are alternately stacked in one direction, and A or X is at least partially substituted with a dopant, wherein a topologically protected metallic interface is present at an interface between the AX substance and the $D_2X'_3$ substance, and wherein the presence of the topologically protected metallic interface is controlled by the dopant.

2. The superlattice thermoelectric material of claim 1, wherein A is Sn.

3. The superlattice thermoelectric material of claim 2, wherein a weight percentage of Sn is in a range of from 3% inclusive to 5% inclusive based on a weight of D.

4. The superlattice thermoelectric material of claim 1, wherein the dopant includes a p-type dopant to be substituted into A or an n-type dopant to be substituted into X.

5. The superlattice thermoelectric material of claim 4, wherein the p-type dopant includes at least one of Ga, In, Zn, Cu, Ag, or Sn.

6. The superlattice thermoelectric material of claim 4, wherein the n-type dopant includes at least one of Cl, Br, or I.

7. The superlattice thermoelectric material of claim 4, wherein at least one of the p-type dopant or the n-type dopant is doped such that the metallic interface is present between the AX substance and the $D_2X'_3$ substance.

8. The superlattice thermoelectric material of claim 1, wherein the AX substance is an insulator, or the AX substance is a substance with a topologically protected surface having a property of a metal only at the surface.

9. The superlattice thermoelectric material of claim 1, wherein the $D_2X'_3$ is a substance with a topologically protected surface having a property of a metal only at the surface.

10. The superlattice thermoelectric material of claim 1, wherein the AX substance is at least one of GeTe, SnTe, GeSe, or SnSe.

11. The superlattice thermoelectric material of claim 1, wherein the $D_2X'_3$ substance is $Bi_2Te_3$ or $Sb_2Te_3$.

12. A thermoelectric device including a superlattice thermoelectric material, the device comprising:

a thermoelectric material including a first thermoelectric element and a second thermoelectric element, each being made of a superlattice thermoelectric material; and a plurality of electrodes electrically connected to each other in series via the first thermoelectric element and the second thermoelectric element, wherein the superlattice thermoelectric material is represented by a following Chemical Formula 1:

<Chemical Formula 1>$(AX)_n(D_2X'_3)_m$, wherein, in the Chemical Formula 1,

A is at least one of Ge, Sn, or Pb, each of X and X' is a chalcogen element, and at least one of S, Se, or Te, D is at least one of Bi or Sb, each of n and m is an integer between 1 and 100, wherein n-layer of the AX substance and m-layer of the $D_2X'_3$ substance are alternately stacked in one direction, wherein a sum of n and m has a constant value, and A or X is at least partially substituted with a dopant, wherein a topologically protected metallic interface is present at an interface between the AX substance and the $D_2X'_3$ substance, and with the dopant wherein the presence of the topologically protected metallic interface is controlled by the dopant.

13. The device of claim 12, wherein the first thermoelectric element has a property of an n-type semiconductor, and the second thermoelectric element has a property of a p-type semiconductor.

14. The device of claim 13, wherein a dopant for the property of the p-type semiconductor includes at least one of Ga, In, Zn, Cu, Ag, or Sn.

15. The device of claim 13, wherein a dopant for the property of the n-type semiconductor includes at least one of Cl, Br, or I.

16. The device of claim 13, wherein at least one of a p-type dopant or a n-type dopant is doped such that the metallic interface is present between the AX substance and the $D_2X'_3$ substance.

17. The device of claim 12, wherein A is Sn.

18. The device of claim 17, wherein a weight percentage of Sn is in a range of from 3% inclusive to 5% inclusive based on a weight of D.

* * * * *